United States Patent [19]

Pace et al.

[11] Patent Number: 5,436,594
[45] Date of Patent: Jul. 25, 1995

[54] FULLY DIFFERENTIAL TRANSCONDUCTANCE AMPLIFIER WITH COMMON-MODE OUTPUT VOLTAGE STABILIZATION

[75] Inventors: Gary L. Pace, Boca Raton; James D. Hughes, Boynton Beach, both of Fla.

[73] Assignee: Motorola, Inc., Schaumburg, Ill.

[21] Appl. No.: 324,636

[22] Filed: Oct. 18, 1994

[51] Int. Cl.[6] .............................................. H03F 3/45
[52] U.S. Cl. ..................................... 330/258; 330/261
[58] Field of Search ........................ 330/253, 258, 261

[56] References Cited

U.S. PATENT DOCUMENTS 4,007,427  2/1977  Leidich ........................... 330/258 X

OTHER PUBLICATIONS

Pan Wis, Rolf Schaumann, & Paul Latham, "Design Considerations for Common-Mode Feedback Circuits in Fully-Differential Operational Transconductance Amplifiers with Tuning", pp. 1363–1366. IEEE Proceedings of ISCAS (Singapore) Jun. 1991.

Primary Examiner—James B. Mullins
Attorney, Agent, or Firm—D. Andrew Floam

[57] ABSTRACT

A differential transconductance amplifier consisting of a bipolar differential amplifier (110) and an active load circuit (120) for the bipolar differential amplifier (110). The transconductance amplifier is suitable for driving a load (130). The active load circuit (120) comprises a bipolar differential amplifier (140), a metal-oxide-silicon (MOS) amplifier (150), and a resistor R1. The active load circuit (120) generates active load currents IAL1 and IAL2. The output of the transconductance amplifier are the differential output currents I1 and I2 which are supplied to the load (130). Differential output currents I1 and I2 are the sum of the currents into the nodes between the bipolar amplifier circuit (110) and the active load circuit (120). The gain of the transconductance amplifier is controlled by a current source that biases the differential amplifier (110).

11 Claims, 4 Drawing Sheets

FULLY DIFFERENTIAL TRANSCONDUCTANCE AMPLIFIER WITH COMMON-MODE OUTPUT VOLTAGE STABILIZATION

RELATED APPLICATIONS

The present application is related to the following commonly assigned application, filed on even date: Ser. No. 08/324, 634, Differential DC Offset Compensation Circuit, to Pace et al.

FIELD OF THE INVENTION

This invention relates in general to a differential input and differential output transconductance amplifier useful, for example, in a differential direct current (DC) offset compensation circuit.

BACKGROUND OF THE INVENTION

In electronic devices which are battery powered, it is often desirable to minimize battery drain by strobing ON and OFF certain components of the electronic device. An example of such electronic device is a portable communications receiver, such as a selective call receiver (pager). Certain portions of the receiver circuit in the selective call receiver are turned ON and OFF in order to minimize battery drain. One such component of the receiver circuit is an amplifier, such as a transconductance amplifier, used in processing the received modulated signal.

The operating voltage of known prior art fully differential transconductance amplifier circuits with common-mode output voltage stabilization is not low enough to allow for operation from a single cell battery, which can have an end-of-life voltage of approximately 1 volt. This is especially important in portable electronic devices, many of which operate from a single cell battery.

It is desirable to provide a fully differential transconductance amplifier suitable for integrated circuit implementation with common-mode output voltage stabilization, which has a minimal warm-up time and provides a very low input offset voltage. It is further desirable to provide a fully differential transconductance amplifier whose gain is externally controllable, and which will operate from a single cell battery.

SUMMARY OF THE INVENTION

The present invention is directed to a transconductance differential amplifier comprising:
 a first differential amplifier having differential inputs and differential outputs, for generating differential output currents at the differential outputs, the differential inputs of the first differential amplifier corresponding to differential amplifier inputs suitable for connection to a source of differential voltage signals;
 a first bias source coupled to the first differential amplifier;
 an active load circuit having active load outputs providing active load currents which are coupled to the differential outputs of the first differential amplifier, the active load circuit comprising:
  a second differential amplifier comprising third and fourth bipolar transistors each having an emitter, base and collector, the emitters of the third and fourth bipolar transistors being coupled together, the collectors of the third and fourth bipolar transistors being coupled to the differential outputs, respectively, of the first differential amplifier;
  a second bias source coupled to the bases of the third and fourth bipolar transistor of the second differential amplifier;
  a third differential amplifier having differential inputs and differential outputs, the differential inputs of the third differential amplifier being coupled to the collectors of the third and fourth bipolar transistors, respectively, of the second differential amplifier, and the differential outputs of the third differential amplifier being connected together and to the emitters of the third and fourth bipolar transistors;
  a resistor having first and second ends, the first end connected to ground;
  the emitters of the third and fourth bipolar transistors being coupled to the second end of the resistor; and
 differential amplifier outputs suitable for supplying differential amplifier output currents to a load, the differential amplifier output currents comprising a difference between the differential output currents of the first differential amplifier and the active load currents of the active load circuit.

DETAILED DESCRIPTION OF THE DRAWINGS

Figure 1:
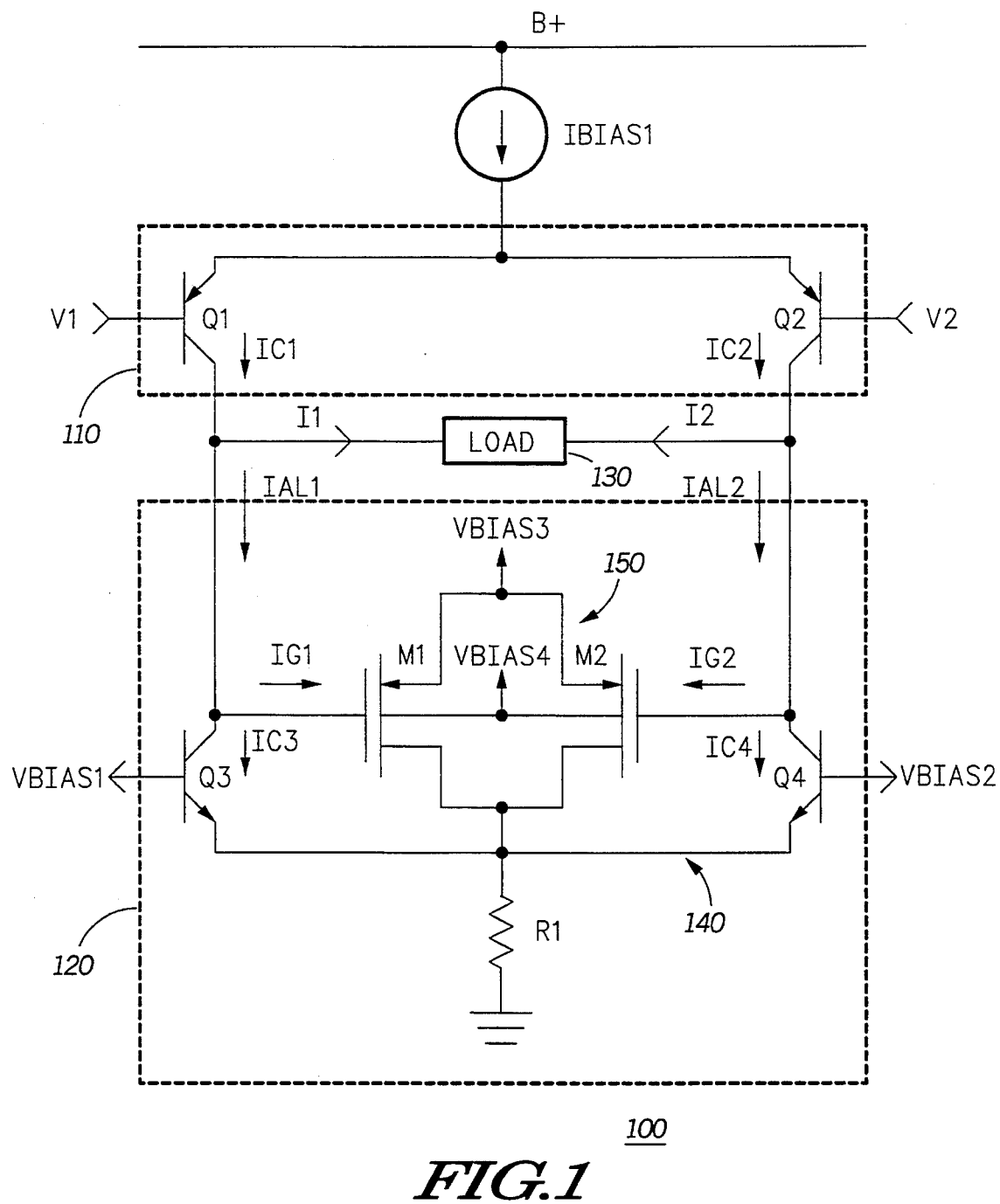
FIG. 1 is an electrical schematic diagram of a differential input and output transconductance amplifier according to a first embodiment of the present invention.

Referring first to FIG. 1, a differential input and output transconductance amplifier according to the first embodiment is shown at 100. The transconductance amplifier 100 comprises a bipolar differential amplifier 110 and an active load circuit 120 for the bipolar differential amplifier 110. The transconductance amplifier 100 is suitable for driving a load 130.

The differential inputs V1 and V2 of the bipolar differential amplifier 110 are the differential amplifier inputs suitable for connection to a source of differential voltage signals (not shown). The outputs of the transconductance amplifier 100 are the differential output currents I1 and I2 and are suitable for connection to the load 130.

The bipolar differential amplifier 110 comprises transistors Q1 and Q2 and is biased by current source IBIAS1 having an input coupled to the voltage supply B+ and an output connected to the emitters of transistors Q1 and Q2. Though not shown, bias adjusting resistors are optionally inserted in the emitter circuits of the transistors Q1 and Q2. As mentioned above, the input to the bipolar differential amplifier 110 are voltages V1 and V2. The output of the bipolar differential amplifier 110 are the collector currents IC1 and IC2.

The active load circuit 120 comprises a bipolar differential amplifier 140, a metal-oxide-silicon (MOS) differential amplifier 150, and a resistor R1. The bipolar differential amplifier 140 comprises transistors Q3 and Q4, and the inputs to the bipolar differential amplifier 140 are the bases of the transistors Q3 and Q4. A second bias source is coupled to the bases of the transistors Q3 and Q4. The second bias source takes on one of several configurations shown in the drawings.

In FIG. 1, the second bias source comprises voltage bias sources VBIAS1 and VBIAS2 which are connected to the bases of transistors Q3 and Q4, respectively. The differential outputs of the bipolar differential amplifier 140 are the collector currents IC3 and IC4 of the transistors Q3 and Q4, respectively.

The MOS differential amplifier 150 comprises, for example, p-type MOS transistors M1 and M2 which are biased by voltage bias sources VBIAS3 and VBIAS4. VBIAS3 is, for example, provided by the voltage supply B+. The voltage bias source VBIAS3 is connected to the source of transistors M1 and M2, and the voltage bias source VBIAS4 is connected to the bulk of the transistors M1 and M2. A bias adjusting resistor is optionally inserted between the voltage bias sources VBIAS3 and the sources of the transistors M1 and M2. The MOS differential amplifier 150 has inputs at the gates of the transistors M1 and M2 and outputs at the drains of the transistors M1 and M2, respectively. Current flowing into the gates of the transistors M1 and M2 are designated currents IG1 and IG2, respectively. The drains of the transistors M1 and M2 are connected in common to resistor R1 and to the emitters of transistors Q3 and Q4. The active load circuit 120 generates active load currents IAL1 and IAL2.

The outputs of the transconductance amplifier 100 are the differential output currents I1 and I2, which are supplied to load 130. Differential output currents I1 and I2 are the sum of the currents into the nodes between the bipolar amplifier circuit 110 and the active load circuit 120 wherein:

$$I1 = IC1 - IAL1 \quad (1)$$

$$I2 = IC2 - IAL2 \quad (2)$$

$$IAL1 = IG1 = IC3 \quad (3)$$

$$IAL2 = IG2 = IC4 \quad (4)$$

The active load currents IAL1 and IAL2 act as current source biases for the bipolar differential amplifier 110. Since the gate currents IG1 and IG2, of transistor M1 and M2 are essentially zero, the active load currents IAL1 and IAL2 are very nearly equal to the collector currents IC3 and IC4 of transistors Q3 and Q4, respectively. Two feedback loops, one consisting of transistors Q3 and M1, the other consisting of transistors Q4 and M2, control the common-mode output voltage of the transconductance amplifier 100.

For proper operation, bias voltage sources VBIAS1 and VBIAS2, and resistor R1 are chosen such that, with MOS transistors M1 and M2 removed, the current sinked by the collectors of transistors Q3 and Q4 is greater than the current sourced from the collectors of transistors Q1 and Q2. A sinked current to sourced current ratio of approximately 2 is acceptable.

In operation, following circuit power up, the larger sinked current pulls down on the gates of MOS transistors M1 and M2. The combined drain currents of M1 and M2 flowing through resistor R1 increases until the base-emitter voltage (Vbe) of transistors Q3 and Q4 is reduced sufficiently to cause the collector currents of transistors Q3 and Q4 to be equal to the collector currents of transistors Q1 and Q2. The common-mode output voltage then stabilizes to a level approximately equal to VBIAS3 minus the gate-source threshold voltage of transistors M1 and M2.

Therefore, the voltage VBIAS3 controls the common mode output voltage of the amplifier. If a voltage source of the desired value is not readily available, but a higher voltage source is available, a resistor can be inserted between the sources of transistors M1 and M2 and the higher voltage source to drop the voltage appropriately. The differential voltage at the output of the amplifier is isolated from the common-mode operation as long as the differential amplifier composed of MOS transistors M1 and M2 remains in the linear operating range. This linear range determines the maximum signal voltage at the amplifier output.

The load on the amplifier 100 is, for example, a resistor, capacitor or combination of elements. The bulk of MOS transistors M1 and M2 is normally tied to B+, but alternatively is tied to other sources of positive voltage. The input offset voltage of the amplifier in FIG. 1 is adjustable to compensate for mismatch in transistor pairs Q1/Q2 and Q3/Q4 by controlling bias voltage VBIAS1 with respect to VBIAS2. For some applications, resistor R1 is replaced with a current sink.

The transconductance gain gm of the amplifier 100 in FIG. 1 is given by:

$$gm = (I2 - I1)/(V2 - V1) = -(qIBIAS1)/4KT$$

where, p1 k = Boltzmann's constant;
T = Temperature in degrees Kelvin; and
q = Electron charge.

Consequently, the gain of the transconductance amplifier 100 is dependent on the current bias source IBIAS1.

Figure 2:
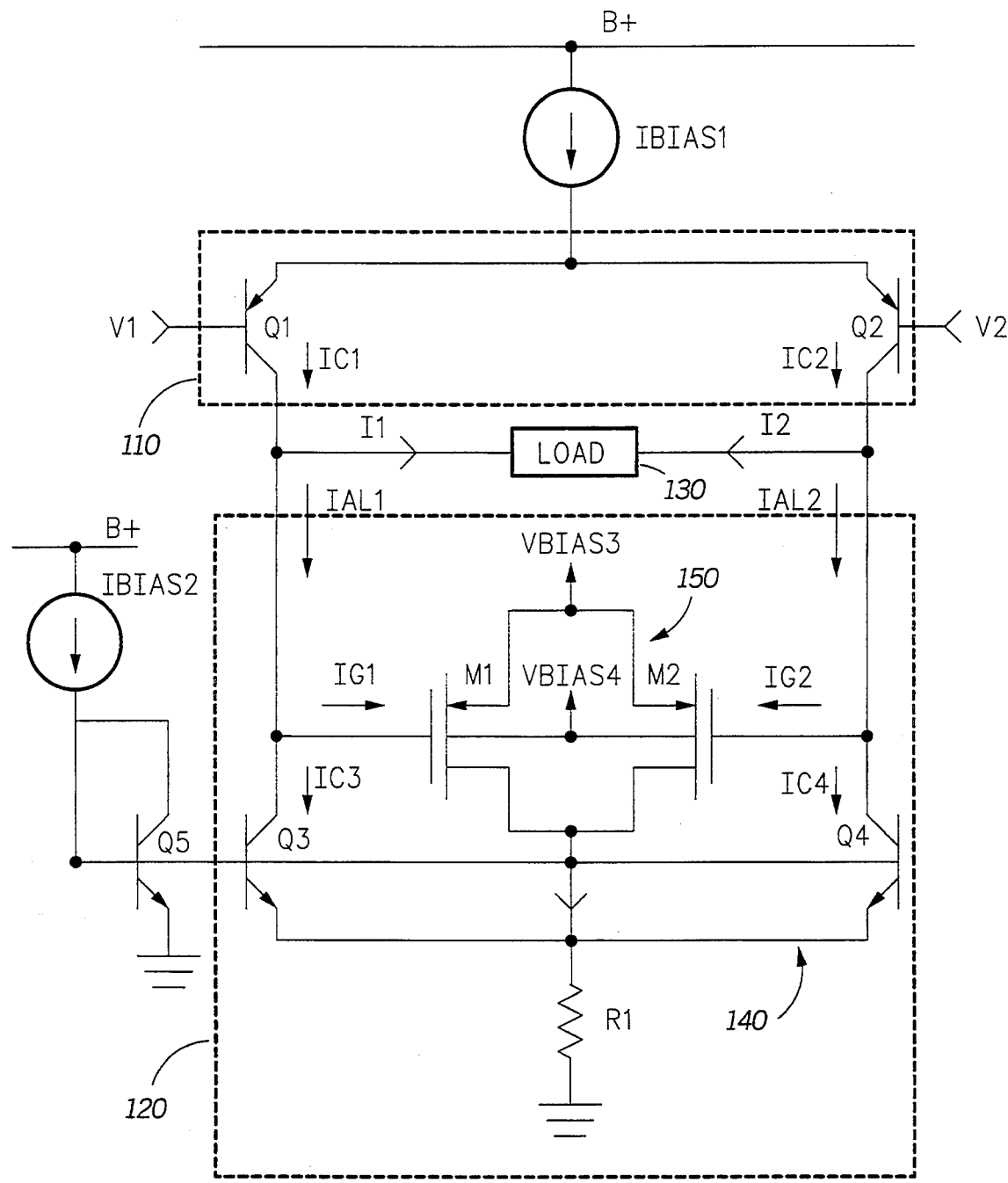
FIG. 2 is an electrical schematic diagram of a differential input and output transconductance amplifier according to a second embodiment of the present invention.

Turning now to FIG. 2, a transconductance amplifier according to the second embodiment is shown at 200. The transconductance amplifier in FIG. 2 is similar to that of FIG. 1 except that second bias source comprises the diode-configured transistor Q5 and current source IBIAS2 instead of the voltage bias sources VBIAS1 and VBIAS2, to simplify the biasing of transistors Q3 and Q4. Diode-connected transistor Q5 and transistors Q3 and Q4 form a current mirror whose gain is adjustable by controlling the voltage drop across resistor R1.

In many applications, the current sources IBIAS1 and IBIAS2 are on the order of 10nA and many times smaller than the typically 1-10 μA current provided by the common mode feedback transistors M1 and M2 through resistor R1. The current source IBIAS2 and the emitter area ratio of diode-configured transistor Q5 with respect to the emitter area ratio of transistors Q3 and Q4 are chosen such that, with MOS transistors M1 and M2 removed, the current sinked by the collectors of transistors Q3 and Q4 is greater than the current sourced from the collectors of transistors Q1 and Q2. A sinked current to sourced current ratio of approximately 2 is acceptable and is achieved with the following parameters:

R1 = 18 K Ohms;

B+ =2 V; and
IBIAS1=IBIAS2 =10 nA.

Without feedback current from common-mode feedback transistors M1 and M2, the value of resistor R1 has an insignificant effect on the current mirrored by transistors Q3 and Q4, due to the low voltage drop developed across resistor R1 by current IBIAS1. For the parameters listed above, the 18K ohm value of resistor R1 sets the current that transistors M1 and M2 source to stabilize the common mode output voltage of amplifier 200, which in this case is 1 µA. The 18 mV across resistor R1 developed by the 1 µA current is determined by the need to reduce the collector currents in transistors Q3 and Q4 by a factor of 2.

Figure 3:
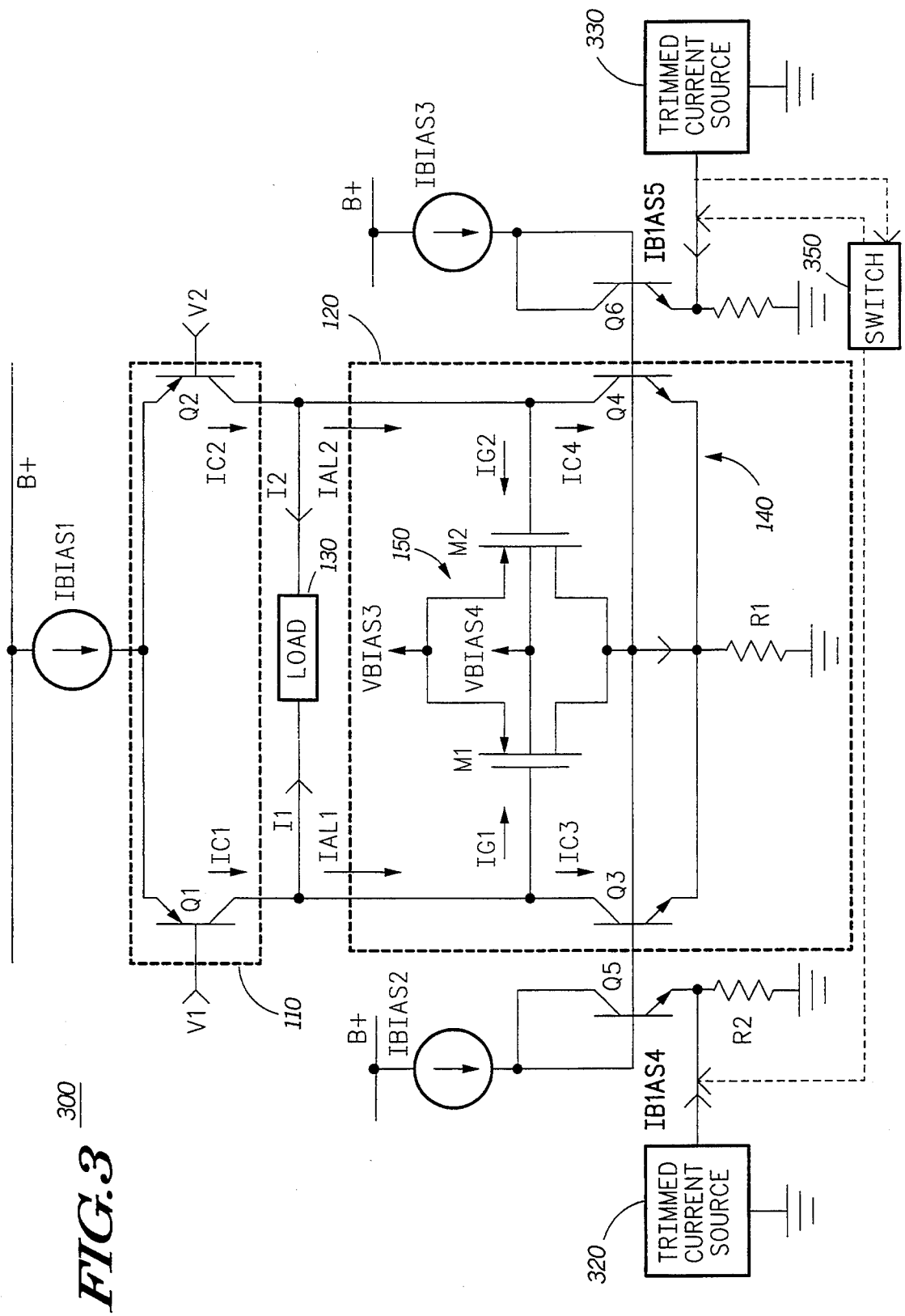
FIG. 3 is an electrical schematic diagram of a differential input and output transconductance amplifier according to a third embodiment of the present invention.

Turning now to FIG. 3, the transconductance amplifier according to the third embodiment is shown at 300. The transconductance amplifier 300 in FIG. 3 is similar to FIG. 2 except that the current mirror consisting of transistors Q5, Q3 and Q4 of the second bias source is split into two current mirrors by adding transistor Q6 and current source IBIAS3. This provides the capability to trim the input offset voltage of the amplifier 300 to compensate for process variations.

Trimmed current sources 320 and 330 are provided which generate currents IBIAS4 and IBIAS5, respectively. The trimmed current sources 320 and 330 are coupled to resistors R2 and R3, respectively, which are inserted in the emitter circuits of transistors Q5 and Q6, respectively. This allows one of the trimmed current sources 320 or 330 to inject current into the appropriate resistor to correct for any input offset voltage error. The amount of input offset voltage correction is determined by the voltage drop across resistor R2 or R3 resulting from current IBIAS4 or IBIAS5, respectively. For most implementations, only a few millivolts of voltage drop will be required to correct any input offset voltage error. The polarity of the input offset voltage correction is determined by which current source (320 or 330) is activated.

Alternatively, a single trimmed current source, such as trimmed current source 330, is employed and a switch 350, configured as a single-pole double-throw switch, is provided which is connected to the trimmed current source 330 and depending on its position of the switch, the switch 350 connects the trimmed current source 330 to resistor R2 or R3. In this alternative case, the trimmed current source 330 is not connected directly to resistor R3 because the switch 350 controls the destination of current from the trimmed current source 330.

The voltage drops across resistors R2 and R3 due to current sources IBIAS2 and IBIAS3 are negligible for the following parameters:
R1=18K Ohms;
R2=R3 =100 Ohms;
IBIAS1=IBIAS2=IBIAS3= 10 nA; and
B+ =2 V.

Such negligible voltage drops allow the trimming of current source 320 or 330 to be predominant in adjusting the input offset voltage of the amplifier 300.

The gains of the amplifiers 200 and 300 in FIGS. 2 and 3 are made easily programmable and externally adjustable by using tracking current sources to implement IBIAS1 and IBIAS2 in FIG. 2 and IBIAS1, IBIAS2 and IBIAS3 in FIG. 3. Amplifier gain in FIG. 1 is also controllable by adjusting IBIAS1, but in some cases VBIAS1 and VBIAS2 will also require adjustment to maintain proper operation of the common mode output voltage feedback circuit. In the limiting case, where IBIAS1 and the tracking current sources are set to zero current, the amplifier of FIGS. 1-3 is disabled with zero gain and the differential output nodes is in a high impedance condition.

The amplifier of FIG. 3 is configurable without the trimmed current sources 320 and 330 and associated resistors R2 and R3. In this case, the transistors Q3 and Q4 are biased by the current sources IBIAS2 and IBIAS3 through transistors Q5 and Q6, respectively, where the emitters of transistors Q5 and Q6 are connected to ground.

Figure 4:
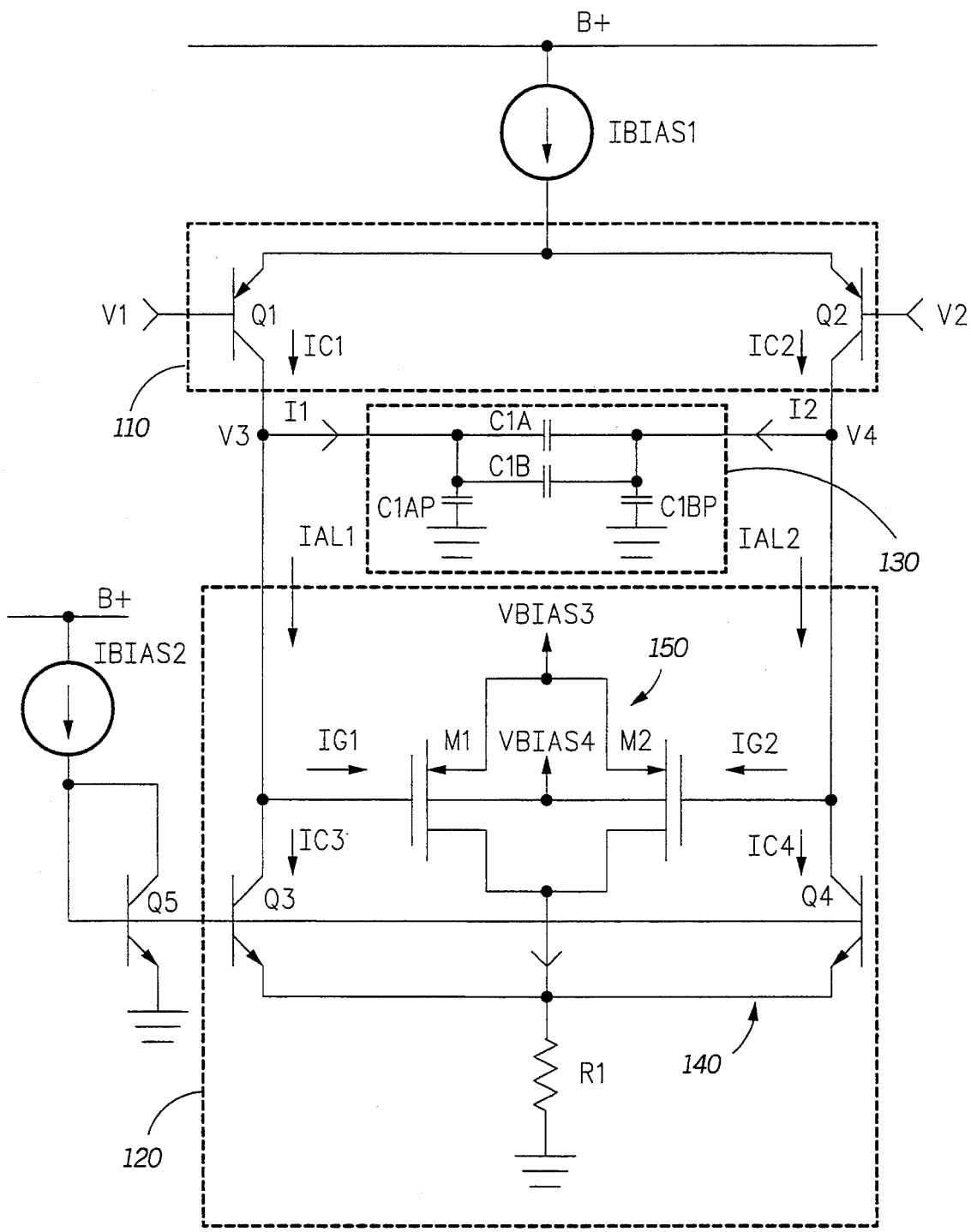
FIG. 4 is an electrical schematic diagram illustrating an exemplary use of the differential input and output transconductance amplifier according to the present invention.

FIG. 4 illustrates an example of an application of the differential transconductance amplifier of the present invention. In FIG. 4, the transconductance amplifier 200 is shown wherein the load 130 comprises a capacitive network load consisting of two capacitors C1A and C1B connected in parallel which forms an effective capacitance C1 between the collectors of transistors Q1 and Q2 to receive the amplifier output currents I1 and I2. The effective capacitance C1 is equal to
C1A+C1B+((C1AP)×(C1BP))/(C1AP+C1BP),
where C1AP and C1BP are the parasitic capacitances of capacitors C1A and C1B, respectively.

The transconductance amplifier 200 with the capacitive load connected thereto forms a differential integrator with a controlled common-mode output voltage. This differential integrator circuit is suitable for use in a wide variety of differential circuit applications where a fast stabilization time following power up is important. One example of an application of the transconductance amplifier in a differential integrator configuration is in a differential DC offset compensation circuit, disclosed in the aforementioned co-pending application.

The improvement in stabilization time is achieved by isolating the differential mode operation of the circuit from the common mode operation. This allows the common mode transient response to be controlled independently of the differential mode signal response. The dominant capacitive element in the circuit, represented by the capacitors C1A and C1B, controls the differential mode response time, but has little effect on the common mode response time. This is because the capacitors C1A and C1B are floating with approximately the same DC bias voltage on each node and the capacitance nodes are driven differentially by a fully differential circuit. Under these conditions, both effective capacitance nodes remain at approximately the same voltage potential during all phases of power down and power up. Therefore, warm-up time is fast since the largest capacitive element in the circuit, represented by capacitors C1A and C1B, does not need significant charging or discharging during circuit stabilization.

FIG. 4 shows the preferred integrated circuit implementation of two equal capacitors used to fabricate the capacitive element of load 130. Capacitors C1A and C1B are paralleled in opposite directions so that there is an equal parasitic capacitor to ground from each node (C1AP and C1BP). This results in each parasitic capacitor (C1AP or C1BP) being approximately 5% of the value of the main capacitor C1A+C1B, which allows a much faster warm-up time than is possible if the main capacitor had one terminal grounded. The transfer function of the differential integrator circuit shown in FIG. 4 is given by:

$$(V4-V3)/(V2-V1)=K/s,$$

where the integrator gain K is given by:

$$K = gm/C1 = -qIBIAS1/4kTC1$$

If the amplifier of FIGS. 2 and 3 is used in an differential integrator circuit such as shown in FIG. 4, the integrator gain K is controlled by using tracking current sources for IBIAS1, IBIAS2 and IBIAS3, as described above, and adjusting IBIAS1 to set the desired gain. If the amplifier of FIG. 1 is used in a differential integrator circuit, the integrator gain is controlled by adjusting IBIAS1, but in some cases VBIAS1 and VBIAS2 also require adjustment to maintain proper operation of the common mode output voltage feedback circuit. In the limiting case, where IBIAS1 and the tracking current sources are set to zero current, the integrator has zero gain, the amplifier differential output nodes are at a high impedance condition and the voltage on the capacitor is stored.

Although the circuits in FIGS. I through 4 are shown operating from a voltage supply B+ of 2 volts, this voltage can be reduced to approximately 1 volt in IC processes which have MOS devices with low gate-source (Vgs) threshold voltages. The minimum circuit voltage supply B+ is limited by the larger of the following voltage drops: one Vbe + one Vce(sat) or one Vgs + one Vce(sat).

The transconductance amplifier according to the present invention has utility in any integrated circuit application requiring a fully differential transconductance amplifier or fully differential transconductance-capacitance integrator with controlled common-mode output voltage.

The above description is intended by way of example only and is not intended to limit the present invention in any way except as set forth in the following claims.

What is claimed is:

1. A differential transconductance amplifier comprising: a first differential amplifier having differential inputs and differential outputs, for generating differential output currents at the differential outputs, the differential inputs of the first differential amplifier corresponding to differential amplifier inputs suitable for connection to a source of differential voltage signals;

a first bias source coupled to the first differential amplifier;

an active load circuit having active load outputs providing active load currents which are coupled to the differential outputs of the first differential amplifier, the active load circuit comprising:

a second differential amplifier comprising third and fourth bipolar transistors each having an emitter, base and collector, the emitters of the third and fourth bipolar transistors being coupled together, the collectors of the third and fourth bipolar transistors being coupled to the differential outputs, respectively, of the first differential amplifier;

a second bias source coupled to the bases of the third and fourth bipolar transistor of the second differential amplifier;

a third differential amplifier having differential inputs and differential outputs, the differential inputs of the third differential amplifier being coupled to the collectors of the third and fourth bipolar transistors, respectively, of the second differential amplifier, and the differential outputs of the third differential amplifier being connected together and to the emitters of the third and fourth bipolar transistors;

a resistor having first and second ends, the first end connected to ground;

the emitters of the third and fourth bipolar transistors being coupled to the second end of the resistor; and differential amplifier outputs suitable for supplying differential amplifier output currents to a load, the differential amplifier output currents comprising a difference between the differential output currents of the first differential amplifier and the active load currents of the active load circuit.

2. The differential transconductance amplifier of claim 1, wherein the first bias source is a first bias current source having an input and an output, the input of the first bias current source coupled to a voltage source, the first differential amplifier comprising first and second bipolar transistors each having a base, emitter and collector, the emitters of the first and second bipolar transistors being connected together and coupled to the output of the first bias current source, the bases of the first and second bipolar transistors corresponding to the differential amplifier inputs, and the differential output currents of the first differential amplifier comprising currents in the collectors of the first and second bipolar transistors, respectively.

3. The differential transconductance amplifier of claim 2, wherein the third differential amplifier comprises:

first and second metal-oxide-silicon MOS transistors each having a gate, source, drain and bulk, the gates of the first and second MOS transistors comprising the differential inputs of the third differential amplifier and being connected to the collectors of the third and fourth bipolar transistors, respectively, of the second differential amplifier, the drains of the first and second MOS transistors comprising the differential outputs of the third differential amplifier and being connected together and to the second end of the resistor, wherein the active load currents comprise a sum of the currents in the collectors of the third and fourth bipolar transistors, respectively, with currents into the gates of the first and second MOS transistors, respectively; and third and fourth bias sources coupled to the sources and bulks, respectively, of the first and second MOS transistors.

4. The differential transconductance amplifier of claim 2, wherein the second bias source comprises:

a first voltage bias source coupled to the base of the third bipolar transistor and a second voltage bias source coupled to the base of the fourth bipolar transistor.

5. The differential transconductance amplifier of claim 2, wherein the second bias source comprises:

a second bias current source; and a diode-configured transistor connected in series with the second bias current source and having a base, the base of the diode-configured transistor coupled to the bases of the third and fourth bipolar transistors.

6. The differential transconductance amplifier of claim 2, wherein the second bias source comprises:

a second bias current source;

a first diode-configured transistor connected in series with the second bias current source and having a base and an emitter;

a first emitter resistor having first and second ends, the first end of the first emitter resistor connected to the emitter of the first diode-configured transistor and the second end of the first emitter resistor connected to ground;

a third bias current source;

a second diode-configured transistor connected in series with the third bias current source and having a base and an emitter; and a second emitter resistor having first and second ends, the first end of the second emitter resistor connected to the emitter of the second diode-configured transistor and the second end of the second emitter resistor connected to ground.

7. The differential transconductance amplifier of claim 2, wherein the second bias source comprises:

a second bias current source;

a first diode-configured transistor connected in series with the second bias current source and having a base and an emitter;

a first emitter resistor having first and second ends, the first end of the first emitter resistor connected to the emitter of the first diode-configured transistor and the second end of the first emitter resistor connected to ground;

a third bias current source;

a second diode-configured transistor connected in series with the third bias current source and having a base and an emitter;

a second emitter resistor having first and second ends, the first end of the second emitter resistor connected to the emitter of the second diode-configured transistor and the second end of the second emitter resistor connected to ground; and at least one trimmed current source coupled to the emitter of the first or second diode-configured transistor.

8. The differential transconductance amplifier of claim 2, wherein the second bias source comprises:

a second bias current source;

a first diode-configured transistor connected in series with the second bias current source and having a base and an emitter;

a first emitter resistor having first and second ends, the first end of the first emitter resistor connected to the emitter of the first diode-configured transistor and the second end of the first emitter resistor connected to ground;

a third bias current source;

a second diode-configured transistor connected in series with the third bias current source and having a base and an emitter;

a second emitter resistor having first and second ends, the first end of the second emitter resistor connected to the emitter of the second diode-configured transistor and the second end of the second emitter resistor connected to ground;

a trimmed current source; and a switch connected to the trimmed current source and to the first end of each of the first and second emitter resistors for supplying current to the emitter of the first diode-configured transistor or the emitter of the second diode-configured transistor, depending on an operating condition of the switch.

9. A differential integrator comprising the differential transconductance amplifier of claim 1, and a capacitive element connected across the differential amplifier outputs to receive the differential output currents of the differential transconductance amplifier.

10. The differential integrator of claim 9, wherein a gain of the differential integrator is adjustable and depends on the first bias source.

11. The differential transconductance amplifier of claim 1, wherein a gain of the differential transconductance amplifier is adjustable and depends on the first bias source.

* * * * *